United States Patent [19]

Mir et al.

[11] Patent Number: 4,988,674
[45] Date of Patent: Jan. 29, 1991

[54] ELECTRICALLY CONDUCTIVE ARTICLES AND PROCESSES FOR THEIR FABRICATION

[75] Inventors: Jose M. Mir, Webster; Liang-sun Hung, Rochester, both of N.Y.

[73] Assignee: Eastman Kodak Company, Rochester, N.Y.

[21] Appl. No.: 308,297

[22] Filed: Feb. 9, 1989

[51] Int. Cl.$^5$ ................................................ B32B 9/00
[52] U.S. Cl. ........................................ 505/1; 505/701; 505/702; 505/703; 505/704; 428/209; 428/426; 428/432; 428/433; 428/457; 428/688; 428/700; 428/901; 428/930; 427/62
[58] Field of Search .......................... 505/1, 701–704; 428/209, 426, 432, 433, 457, 688, 700, 901, 930

[56] References Cited

FOREIGN PATENT DOCUMENTS 290357A 11/1988 European Pat. Off. .
297319A 1/1989 European Pat. Off. .
303083A 2/1989 European Pat. Off. .

OTHER PUBLICATIONS

H. Maeda, Y. Tanaka, M. Fukutomi, and Y. Asano, "A New High $T_c$ Superconductor Without a Rare Earth Element", Japanese Journal of Applied Physics, vol. 27, No. 2, pp. L209 & L210.

Primary Examiner—Patrick Ryan
Attorney, Agent, or Firm—Carl O. Thomas

[57] ABSTRACT

A flexible electrically conductive article is disclosed comprised of an organic film, a conductive crystalline cuprate layer, and a release layer that together form a flexible electrically conductive assembly. The article is prepared by forming a conductive cuprate layer on a refractory substrate with the release interposed. After the cuprate layer is formed, the organic film is bonded to it, permitting the cuprate layer to be stripped intact from the substrate with the organic film. A crystal growth accelerating agent can be associated with the cuprate layer during its formation to minimize the heat energy required for crystallization.

35 Claims, 3 Drawing Sheets

ELECTRICALLY CONDUCTIVE ARTICLES AND PROCESSES FOR THEIR FABRICATION

FIELD OF THE INVENTION

The invention relates to electrically conductive articles. In a specifically preferred form the invention relates to electrically conductive articles which are superconductive at temperatures in excess of 30° K.

BACKGROUND OF THE INVENTION

The Periodic Table of Elements as adopted by the American Chemical Society is employed in designating elements.

The term "superconductivity" is applied to the phenomenon of immeasurably low electrical resistance exhibited by materials. Until recently, superconductivity had been reproducibly demonstrated only at temperatures near absolute zero. As a material capable of exhibiting superconductivity is cooled, a temperature is reached at which resistivity decreases (conductivity increases) markedly as a function of further decrease in temperature. This is referred to as the superconducting transition temperature or, in the context of superconductivity investigations, simply as the critical temperature ($T_c$). $T_c$ provides a conveniently identified and generally accepted reference point for marking the onset of superconductivity and providing temperature rankings of superconductivity for different materials. The highest temperature at which superconductivity is observed in a material is designated $T_o$. Materials which exhibit superconductivity at temperatures in excess of 30° K. are herein referred to as high temperature superconductors.

A variety of compounds containing copper and other metals in combination with oxygen have been observed to be electrically conductive in crystalline form and to be high temperature superconductors. These materials are herein referred to collectively as "conductive crystalline cuprates". Electrically conductive articles including conductive crystalline cuprate layers exhibiting higher temperature superconductivity are illustrated by the following:

R-1 Mir et al published European Patent Application No. 290,357A (priority based on U.S. Ser. No. 46,593, filed May 4, 1987 now U.S. Pat. No. 4,880,770) discloses thin (<5 μm) conductive crystalline cuprate layers formed on refractory substrates at temperatures of at least 900° C. Substrates disclosed for use are alkaline earth oxides (e.g., alumina, magnesia, and strontium titanate) and semiconductors (e.g., silicon and 3-5 compounds). The substrates can include barrier layers interposed between the foregoing substrate portions and the conductive crystalline cuprate layer, the barrier layers disclosed include silica, silicon nitride, and refractory metals (e.g., tantalum, titanium, and zirconium).

R-2 Strom et al published European Patent Application 297,319 (priority based on U.S. Ser. No. 68,391, filed July 1, 1987, now U.S. Pat. No. 4,908,346) contains a disclosure similar to that of R-1, except that a different process of coating is disclosed to produce thick (>5 μm) conductive crystalline cuprate layers.

R-3 Agostinelli et al published European Patent Application No. 303,083 (priority based on U.S. Ser. No. 85,047, filed Aug. 13, 1987 now abandoned, and U.S. Ser. No. 46,593, cited above) contains a disclosure similar to that of R-1 and R-2, but requires a barrier layer containing a metal in its elemental form or in the form of an oxide or silicide chosen from the group consisting of magnesium, a group 4 metal, or a platinum group metal.

R-4 Hung et al U.S. Ser. No. 153,699, filed Feb. 8, 1988, now U.S. Pat. No. 4,908,348, contains a disclosure similar to that R-1 and R-2, except that a silicon substrate portion is separated from the cuprate layer by a barrier layer triad. The barrier layer triad is comprised of a first triad layer located adjacent the silicon substrate portion consisting essentially of silica, a third triad layer remote from the silicon substrate portion consisting essentially of one Group 4 heavy metal oxide, and a second triad layer interposed between the first and third triad layers consisting essentially of a mixture of silica and at least one Group 4 heavy metal oxide.

R-5 Agostinelli et al U.S. Ser. No. 214,976, filed July 5, 1988 (as a continuation in part of U.S. Ser. No. 172,926, filed March 25, 1988, now abandoned in favor of U.S. Ser. No. 359,306, filed May 31, 1989) contains a disclosure similar to R-1, R-2, R-3, and R-4, but employs as a conductive crystalline cuprate layer a crystalline heavy pnictide mixed alkaline earth copper oxide wherein the heavy pnictide is bismuth and optionally contains antimony in a concentration of less than 10 mole percent based upon bismuth. In a preferred form the cuprate is similar to that disclosed by H. Maeda, Y. Tanaka, M. Fukutom, and Y. Asano, "A New High $T_c$ Superconductor Without a Rare Earth Element", Japanese Journal of Applied Physics, Vol. 27, No. 2, pp. L209 &L210. Crystallization at temperatures as low as 800° C. are disclosed.

R-6 Agostinelli et al U.S. Ser. No. 208,706, filed June 20, 1988, contains a disclosure similar to the preceding, but requires the presence of a metal or metal oxide (copper or copper oxide) layer interposed between the substrate and the cuprate layer. The interposed layer facilitates clean etchant removal of the cuprate from the substrate.

R-7 Lelental et al U.S. Ser. No. 208,707, filed June 20, 1988, adds to the preceding disclosures a technique for forming a mixture of (1:2:3) and (2:1:1) rare earth alkaline earth cuprate phases.

R-8 Lelental et al U.S. Ser. No. 236,420, filed Aug. 25, 1988, discloses an improvement on the technique of R-7.

R-9 Chatterjee U.S. Ser. No. 290,670 filed, Dec. 27, 1988, discloses the protection of the conductive cuprates from degradation by contact with ambient air by employing a polyester ionomer or alkyl cellulose as a passivant.

R-10 Strom U.S. Ser. No. 291,921 filed Dec. 29, 1988, is similar to R-2, but employs a bismuth containing conductive cuprate of the type disclosed by R-5.

All of the copending patent applications are commonly assigned. The foregoing are here incorporated by reference.

From the foregoing it is apparent that electrically conductive articles containing conductive crystalline cuprate layers have in each instance been prepared by firing a cuprate layer to its crystallization temperature on a substrate (optionally including one or more barrier layers) selected from a relatively limited class of inorganic materials. The substrate materials must withstand the high firing temperatures, must not release ions that excessively degrade the conduction properties of the cuprate layer during, and must provide a surface for the cuprate layer that is conducive to crystal formation and growth.

None of the conductive crystalline cuprate layer and substrate combinations heretofore successfully produced have satisfied the need for electrically conductive, particularly high temperature superconductive, articles having a high level of flexibility. For example, none of these articles have exhibited the flexibility of electrically conductive articles employing organic (e.g., polymeric) film supports. The reason for this is quite obvious. The minimum crystallization firing temperatures plausibly conceivable for the fabrication of conductive crystalline cuprate layers are still well in excess of the maximum temperatures at which organic compounds, including even the most thermally stable polymers, possess dimension stability. The overwhelming majority of organic materials decompose at temperatures below 300° C. This is well below the lowest reported crystallization temperature of a conductive cuprate layer and more than 400° C. below typical cuprate crystallization temperatures.

SUMMARY OF THE INVENTION

The purpose of this invention is to provide flexible electrically conductive articles which contain both a conductive crystalline cuprate layer and a support comprised of an organic film. Thus, the present invention makes possible achieving in a single electrically conductive article both high temperature superconductivity an highly flexible article constructions.

The invention has been made possible by the discovery of a novel technique for forming a conductive crystalline cuprate layer on a substrate so that it can be released after its formation. Release materials have been discovered that permit the physical stripping of the conductive crystalline cuprate layer intact from the substrate after lamination to a flexible organic film. The release layer discovery not only required finding appropriate release properties, but also sufficient compatibility with the cuprate layer to allow its crystallization into a form having a high level of electrical conductivity—e.g., high temperature superconductivity.

In one aspect this invention is directed to an electrically conductive article comprised of a support and, bonded to the support, an electrically conductive crystalline cuprate layer. The invention is characterized in that the support is comprised of an organic film, a release layer overlies the cuprate layer and the support, the cuprate layer and the release layer together form a flexible electrically conductive unit.

In another aspect this invention is directed to a method of forming an electrically conductive article comprised of a support and an electrically conductive crystalline cuprate layer, including the steps of providing a refractory substrate and forming an electrically conductive crystalline cuprate layer on the substrate. The invention is characterized in that a release layer is formed on the refractory substrate, the cuprate layer is formed on the release layer, an organic film support is bonded to the cuprate layer, and the release layer, the cuprate layer, and the organic film support are formed to constitute a flexible electrically conductive article when stripped as a unit from the refractory substrate.

In a preferred form of the invention at least one of the release layer and the cuprate layer are modified by the inclusion of a crystal growth accelerating agent to allow the thermal energy (time and/or temperature) of firing to be reduced.

BRIEF DESCRIPTION OF THE DRAWINGS

The invention can be better appreciated by reference to the following detailed description considered in conjunction with the drawings, wherein.

DETAILED DESCRIPTION OF THE INVENTION

Figure 1:
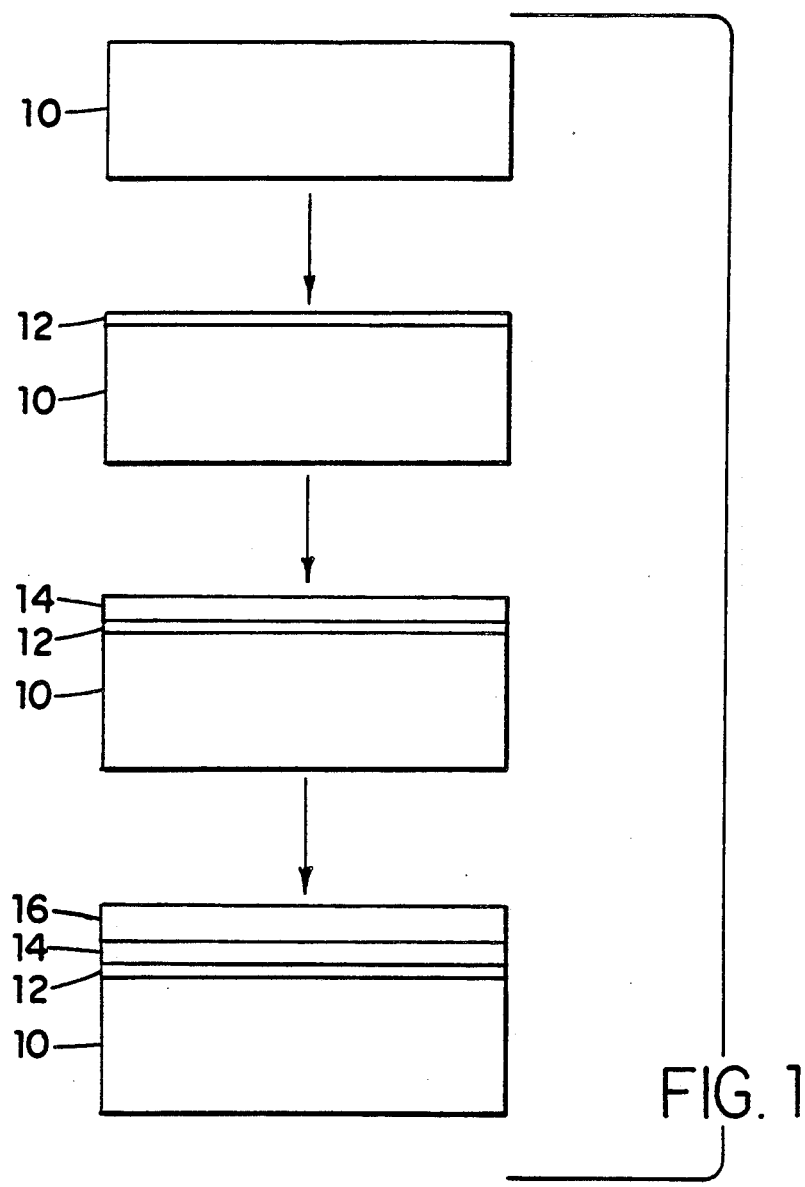
FIG. 1 is a schematic diagram illustrating intermediate articles produced by a sequence of process steps.

The present invention can be appreciated by reference to FIG. 1. A refractory substrate 10 optionally including one or more barrier layers on its upper surface is provided as a starting material. The refractory substrate can take any of the varied forms taught by the prior art as being suitable substrates for the formation of conductive crystalline cuprate layers. For example, the refractory substrate can take any of the varied forms described by R-1 to R-10, cited above.

Onto the substrate is coated a release layer. The release layer must be thermally stable at temperatures up to the crystallization temperature of a subsequently formed overlying cuprate layer. Additionally, the release layer is chosen to provide poor adhesion between the overlying cuprate layer and the refractory substrate. A preferred class of materials for forming release layers are metals chosen from groups 8 to 11 and periods 5 and 6 of the Periodic Table of Elements. These metals are silver, gold, and the metals of the light platinum metal triad of elements (ruthenium, rhodium, and palladium) and the heavy platinum metal triad of elements (osmium, iridium, and platinum). Of the platinum metals, osmium and platinum are preferred. The metals can be employed alone or together (e.g., as alloys). Gold and the platinum metals are particularly advantageous for use in forming the release layer, since they do not oxidize at the firing temperatures of the cuprate layers and can be employed at subsequent manufacturing stages to facilitate circuit bonding (e.g., chip and/or lead attachment) to the conductive cuprate layer. Gold is a specifically preferred metal for formation of the release layer and for circuit bonding.

Any convenient conventional technique, such as vacuum vapor deposition, sputtering, electroless plating, etc., can be employed for depositing the release layer. A convenient practical thickness for the release layer is from about 0.6 to 5 μm with a thickness of about 0.8 to 2 microns being preferred. The release layer thickness can be further increased without penalty, aside from the use of additional amounts of materials.

Onto the release layer is coated a cuprate or precursor thereof which, following firing to crystallization temperatures, typically in the range of from about 800° to 1000° C., is transformed into a conductive crystalline cuprate layer 14. Any of the conventional cuprate starting material compositions and processes for their deposition can be employed in the practice of this invention. R-1 to R-10, cited above, contain directly applicable teachings. It is preferred to maintain the thermal energy input to the cuprate layer during crystallization to minimum or near minimum levels. This obviates the risk of localized cuprate penetration of the release layer with resultant localized unwanted bonding to the substrate.

It has been discovered that the thermal energy input (time and/or temperature of firing) required for cuprate layer crystallization can be reduced by associating with the cuprate layer a crystal growth accelerating agent. This can be achieved by modifying one or both of the cuprate layer or release layer by the inclusion of the crystal growth accelerating agent.

One preferred approach, which constitutes an original observation of this invention, is to form the release layer as a composite of two layers. The first of these layers is coated on the refractory substrate as described above. The first layer is then overcoated with a thin second layer of a crystal growth accelerating agent. The latter offsets the less favorable crystallization environment created when contact of the cuprate layer with the refractory substrate materials (including barrier layers) is replaced by contact with the metal or metals forming the first layer. For example, whereas the refractory substrates themselves take crystalline forms similar to that of the crystalline cuprates and therefore constitute favorable sites for epitaxy, the metal or metals forming the first layer take amorphous, noncrystalline forms at the temperatures of firing and therefore offer no opportunity for epitaxy.

Any amount of the accelerating agent capable of facilitating nucleation in the cuprate layer and thereby accelerating its crystallization can be employed. When the accelerating agent is provided in the form of a second layer of a composite release layer, it is generally preferred that sufficient crystal growth accelerating agent be present to form a continuous film. Thus, second layers ranging upward from about 100Å, preferably at least 500Å, are contemplated.

In a specifically preferred form of the invention, it has been found that a silver second layer can help nucleate and crystallize the cuprates. In an optimum form, the silver layer is in the range of from about 0.1 to 1 μm in thickness. In all cases where this was done, films with larger grain size were obtained, although the thicker (at least 0.5 μm in thickness) second layers were found to be slightly more effective. Since a significant degree of mixing between the Au and the Ag was observed even at 550° C., thicker layers probably minimized dilution of Ag at the metal cuprate interface. In the completed article no continuous silver layer has been identified. Microscopic analysis of silver layers coated over gold suggests that the silver forming the second layer may contract to beads on the surface of the gold layer during firing, with the beads serving as nucleation sites for the cuprate crystals. Where silver is employed as the sole metal forming the release layer, thicknesses in the ranges set forth above for gold and the platinum metals should be employed, but with minimum silver layer thicknesses in this instance preferably being greater than 1 μm to assure that a continuous silver layer remains present at the conclusion of firing.

Another mechanism for accelerating crystal growth is to modify the composition of the cuprate layer starting materials to include alkali metal ions, such as sodium and/or lithium ions. While the mechanism by which the alkali metal ions accelerate crystal growth has not been conclusively explained, it is believed that the alkali metal ions provide a flux environment that accelerates crystal growth at firing temperatures.

While conductive crystalline cuprate layers exhibit the brittleness characteristic of oxides at the thicknesses characteristic of most self-supported films, they exhibit flexibility at thicknesses below about 1 mil (25 μm). Since flexibility increases as cuprate layer thickness decreases, the choice of maximum acceptable layer thicknesses is dictated by the end use application to be served. Minimum acceptable layer thicknesses are dictated not by flexibility, but by required current carrying capacities. For signal level electrical transmission applications in which a degree of flexibility comparable with those of organic polymeric film support circuits is desired, the preferred thickness of the crystalline cuprate layer is typically in the range of from about 0.1 to 10 μm, optimally from about 0.5 to 5 μm.

Once formed on the refractory substrate, the flexible cuprate layer need not be immediately removed. For example, the layer 16 can take the form of a temporary protective layer of any convenient type. The protective layer can perform the function of limiting the contact of air or other moisture sources with the crystalline cuprate layer prior to completion of electrical circuit fabrication. For example, the protective layer can take the form of a passivant, such as a polyester ionomer or alkyl cellulose, as disclosed by R-9 above, or the protective layer can take the form of a moisture impenetrable film, such as any convenient polymeric film. In a simple arrangement a protective polymeric film can be simply laid over the cuprate layer with static attraction relied upon to hold the film in position.

In a preferred form of the invention the layer 16 deposited on the conductive cuprate layer 14 is a photocurable polymer that becomes a permanent part of the support for the completed circuit element. In a specific preferred form the layer 16 is spread as a fluid film precursor (e.g., a monomer or low molecular weight polymer containing vinyl unsaturation) over the cuprate layer and then exposed to actinic radiation (e.g., ultraviolet) to produce a solid polymeric protective layer. Until subsequent fabrication steps are taken, the polymeric protective layer acts as both a moisture and abrasion barrier for the cuprate layer.

Figure 2:
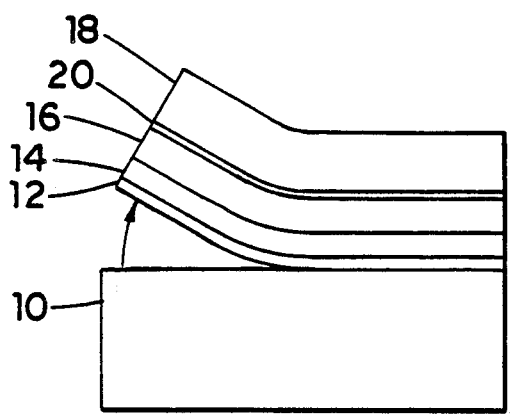
FIG. 2 is a schematic diagram illustrating an article according to the invention as it would appear during stripping.

In FIG. 2 a flexible organic film 18 is bonded to the protective layer 16 by an interposed adhesive layer 20. By grasping the substrate 10 and the film 18 and pulling in the direction shown by the arrow, the layers are separated from the substrate at its interface with the release layer 12. It should be noticed that the presence of the protective layer 16 is reducing the degree to which the cuprate layer is bent or strained during stripping. Thus, the protective layer is in part absorbing the stress of stripping. Completion of stripping results in an electrically conductive article according to the invention shown in FIG. 3B.

Figure 3A:
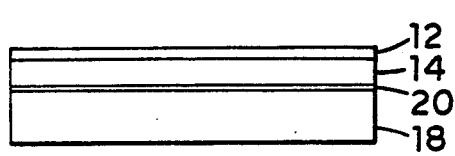
FIGS. 3A and 3B illustrate two different forms of the articles of this invention.
Figure 3B:
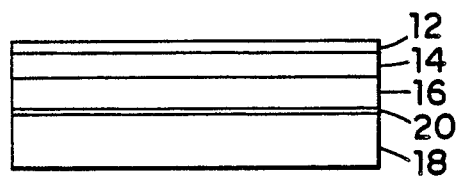

When the protective layer 16 is omitted or is chosen not to form a permanent part of the completed device, an electrically conductive article is formed as shown in FIG. 3A.

It is specifically contemplated that the electrically conductive articles can be fabricated to the stage shown in FIG. 2 just prior to stripping and sold to end users in this form. In this instance the end user performs the stripping step, and the substrate 10 serves as a protective member during shipment and storage.

In another form of the invention the stripping step can be performed as shown in FIG. 2, allowing the refractory substrate to be reused, if desired. The refractory substrate can be replaced with any convenient protective member. For example, a flexible organic film can serve the function of a protective member. When used, the flexible organic film not only protects the cuprate layer from moisture, but also acts to reduce flexing stresses placed on the cuprate layer. In a specifically preferred form the organic film serving as the protective member is chosen to match at least approximately the flexibility of the support on the opposite side of the cuprate layer. This has not only the advantage of stress reduction, but also eliminates any tendency of the film to spontaneously curl. This produces an assembly that lies flat and can be more conveniently handled by the end user.

Figure 4:
FIG. 4 illustrates a third different form of the articles of this invention.

FIG. 4 illustrates an alternative embodiment in which the polymer protective layer 16 alone forms the organic film support.

Figure 5A:
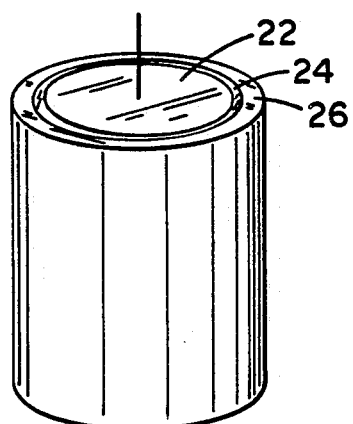
FIGS. 5A, 5B, and 5C are schematic diagrams illustrating additional process steps and a fourth different form of articles according to this invention formed thereby.
Figure 5B:
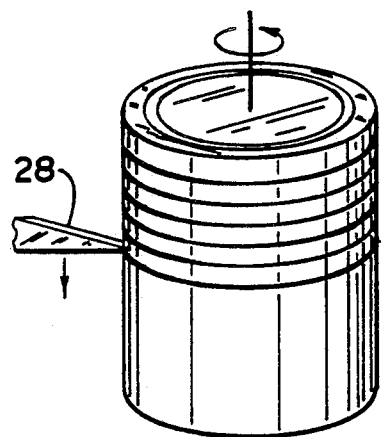
Figure 5C:
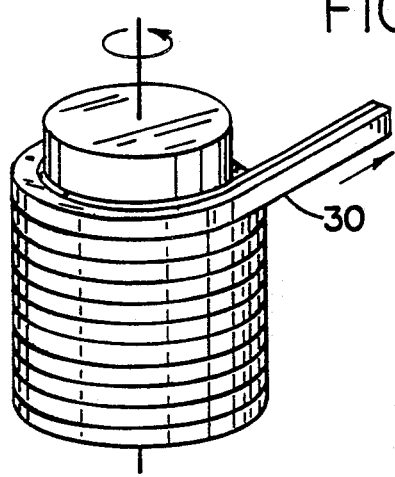

FIGS. 5A-C illustrate a continuous method sequence in which various layers are coated and processed on a cylindrical drum 22 which can otherwise be identical to any of the refractory substrates described above. Layer processing is similar to that illustrated in FIG. 1. Following the formation of the release and crystalline layers (illustrated as composite layer 24) and the organic support layer 26, the drum is skived in a helical fashion, as shown at 28 in FIG. 5B, and a linear strip 30 is subsequently removed, as shown at 30 in FIG. 5C.

Figure 6:
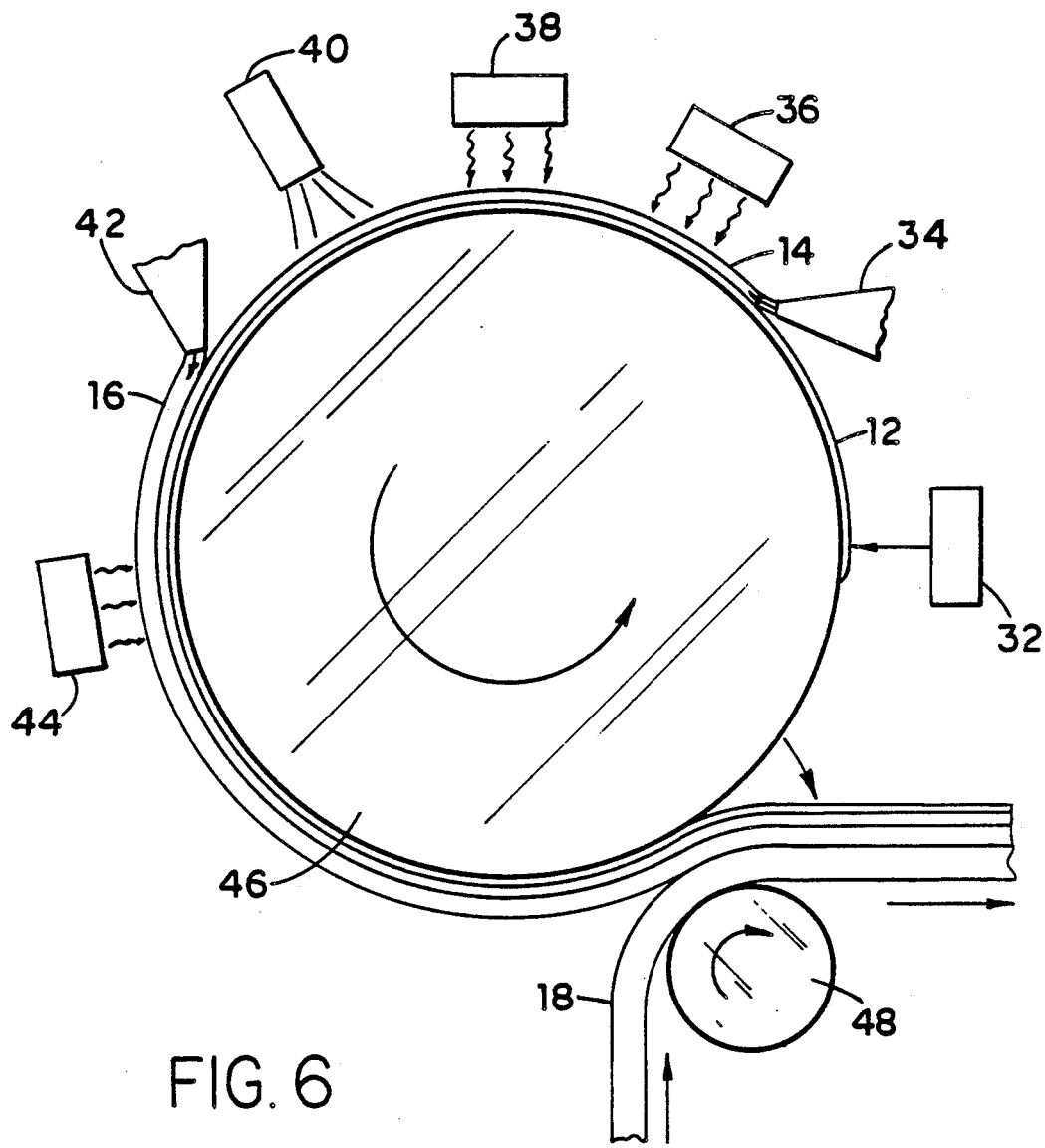
FIG. 6 is a schematic diagram illustrating a varied process and article formed thereby.

An alternative embodiment, which also provides an elongated continuous electrically conductive article, is illustrated in FIG. 6. In this embodiment, a refractory drum 46 is also employed. A release layer 12 is deposited first on the drum at coating station 32. This is followed by coating the as yet uncrystallized cuprate or a precursor as a layer 14 at coating station 34. Heating stations 36 and 38 are shown for first volatilizing components of the cuprate layer and then converting the cuprate layer to a crystalline form. The conductive crystalline cuprate layer is next reduced in temperature at cooling station 40. The protective layer 16 is applied at coating station 42 followed by photocuring at station 44. The resulting coatings are next laminated to a flexible organic (e.g., polymeric) film using roller 48. While the method as shown produces the article of FIG. 3B, it is apparent that it can be readily modified to formation either the article of FIG. 3A or FIG. 4.

The organic film, the cuprate layer, the release layer, and any optional layers, such as the adhesive, bonding, and/or protective layers together form a flexible electrically conductive unit which can itself form an electrically conductive article or be combined with other conventional electrical circuit features to complete an electrically conductive article. The electrically conductive unit formed after peeling from the refractory substrate on which it is formed is sufficiently flexible to be bent through a radius of curvature of 5 cm (preferably 2 cm and optimally less than 2 cm) and returned to a flat layer configuration while still retaining the capability of satisfying its intended electrical end use. Flexible units can be fabricated which produce no observable physical or electrical degradation upon flexure through these radii of curvature. Since both the metals forming the release layer and the organic materials forming the film, protective, and bonding layers are highly flexible, the minimum feasible radius of curvature of the flexible articles is determined by the thickness of the cuprate layer. Thus, the electrically conductive elements of this invention of highest flexibility are those in which the cuprate layer is within the preferred thickness ranges set forth above.

The details of the preparation and performance of articles according to this invention are illustrated by the following examples.

EXAMPLE 1

A single crystal MgO substrate was coated on a {100} crystallographic face with a Au film approximately 6000Å thick using a D.C. sputtering unit in an Ar gas atmosphere. A precursor to produce $YBa_2Cu_3O_{7-y}$ was made as follows: A yttrium precursor was made by mixing 2.35 g of yttrium acetate tetrahydrate with 7.65 g of 2-ethylhexanoic acid. The mixture was refluxed at the boiling point for 10 minutes until a clear solution was obtained. To compensate for solvent evaporation during heating, 0.7 g of 2-ethylhexanoic acid was then added to the solution. The resulting precursor had 6.22% yttrium concentration by weight. The copper precursor was made by mixing 2.0 g Cu acetate with 8.0 g 2-ethyl hexanoic acid. The mixture was refluxed at the boiling point for 15 minutes until a clear solution was obtained. To compensate for solvent loss during evaporation, 0.55 g of 2-ethylhexanoic acid was added to the solution. The resulting precursor had 6.36% Cu concentration by weight. The $YBa_2Cu_3O_{7-y}$ precursor was made by mixing 6.22 g of the copper precursor with 2.138 g of barium cyclohexanebutyrate (26.6% Ba by weight) with 1.75 g toluene. This mixture was then heated to allow the barium cyclohexanebutyrate to go into solution. To this solution, 3.0 g of the yttrium precursor was added along with 2.0 g Kodak #2315 TM rosin to act as a film former. The resulting solution was passed through a 1.2 $\mu$m filter to remove residual particles.

The $YBa_2Cu_3O_{7-y}$ precursor was spin coated on the Au/ substrate at 3500 RPM for 20 seconds. The film was heated from room temperature at approximately 50° C. per minute on a hotplate to 550° C. and held at that temperature for 5 minutes. After heating, the film was allowed to cool to room temperature, and a second layer of $YBa_2Cu_3O_{7-y}$ was deposited using the same procedure. Film thickness at this point was approximately 0.5 $\mu$m. The film exhibited an amorphous structure.

The multilayer film was then processed at 925° C. in a Lindbert TM furnace by rapidly heating the sample to that temperature, holding for 3 minutes, and allowing the sample to cool to room temperature in approximately 30 minutes. X ray diffraction (XRD) showed a (1:2:3) superconducting perovskite structure, characteristic of superconducting $YBa_2Cu_3O_{7-y}$. Transfer of the multilayer film from the MgO substrate to a flexible organic substrate was accomplished by contacting the adhesive surface of an adhesive tape to the top of the $YBa_2Cu_3O_{7-y}$ layer, and peeling away the multilayer film at the Au MgO substrate interface. The tape used was 3M Scotch Magic 810 TM flexible organic polymer tape having a width of about 1.25 cm. The tape is approximately 25 $\mu$m thick. The flexible article was found to be continuous from end to end. The 123 film was electrically tested by removing the gold layer using Transene TFA TM gold etchant. The black $YBa_2Cu_3O_{7-y}$ film was also found to be electrically continuous from end to end.

EXAMPLE 2

The procedure of Example 1 was repeated, except that fused $SiO_2$ was used as a substrate. The multilayer structure was processed on the hotplate as previously described and heated to 900° C. for 5 minutes in a Lindberg furnace. XRD showed the presence of the 123 perovskite structure. After transfer, and removal of the Au, as in Example 1, some evidence of cracking in the $YBa_2Cu_3O_{7-y}$ layer was observed using transmission optical microscopy. The film, however, was still electrically continuous from end to end.

EXAMPLE 3

A silica ($SiO_2$) layer 5000Å thick was formed on a monocrystalline silicon substrate by thermal oxidation. A zirconium metal film 1500Å in thickness was then evaporated on the silica layer and subsequently annealed in vacuum at 850° C. for 30 minutes to produce a barrier layer triad from the substrate up of silica, zirconium silicide and zirconia, respectively. An 800° C. treatment in air followed to oxidize the zirconium silicide layer. A gold film 6000Å in thickness was deposited over the barrier layer using a d.c. sputtering unit in an argon gas atmosphere. Two layers of the $YBa_2Cu_3O_{7-y}$ superconductor were then deposited over the gold layer by the method of Example 1. The films were then processed at 925° C. in a Lindberg furnace by rapidly heating the sample so that temperature, holding for 5 minutes and allowing the sample to cool to room temperature in approximately 30 minutes. The film was transferred to adhesive tape as in Example 1. After etching the Au layer with Transene TFA ™ etchant as in Example 1, a crystalline film was observed, with a grain size of approximately 1 μm. The film was found to be electrically continuous.

EXAMPLE 4

The procedure of Example 2 was repeated. After the 900° C. treatment, however, an organic layer was spin coated to provide additional mechanical support to the multilayer films. Norland #61 ™ ultraviolet responsive photopolymer (viscosity 300 cp) was spin coated at 5000 RPM for 20 seconds resulting in a film thickness of 37 μm. The layer was then hardened by exposing to ultraviolet using a Blak Ray Model B-100A ™ lamp for 10 minutes. The photopolymer hardened to a tough film without shrinkage and significantly improved the mechanical integrity of the multilayer structure both during and after transfer. The transferred films also provided a more effective base to provide a reliable electrical connection. The photopolymer layer did not significantly reduce the flexibility of the article.

EXAMPLE 5

The procedure of Example 2 was repeated, except that the substrate is a Si wafer with a thermally grown silica barrier layer (0.8 μm thick), covered with a 3.0 μm thick Au layer. A photopolymer film was applied as in Example 4. The films were then transferred from the Si substrate to a transparent adhesive tape as in Example 1. The tape was then sliced into thin 1 mm wide strips, 75 mm long. The resistance from end to end of the tape was approximately 0.85 ohms. The resistance was constant during flexure of the tape down to a 1 cm radius of curvature.

EXAMPLE 6

A precursor used to fabricate ceramic films having composition $Bi_2Sr_2CaCu_2O_{8+x}$ (2:2:1:2) was prepared. This compound was a superconducting cuprate with a transition temperature of approximately 85° K. The bismuth precursor was bismuth octoate available commercially from Shepherd Chemicals (8.2% bismuth by weight). The solution was concentrated by heating at 100° C. in a Buchi Model 461 ™ water bath while being rotated in a Buchi Model E1131 Rotovapor ™ rotary evaporator. The resulting concentrated solution was 18.76% bismuth by weight. The calcium precursor was made by treating calcium carbonate with excess 2-ethylhexanoic acid and xylene as needed at 120° C. for 18 hours The mixture was then filtered and dried with a Kodak Type 3A ™ molecular sieve having 1.6 mm pellets. This was followed by concentration and filtering of the solution with 1.2 μm filters. Analysis showed 3.9% Ca by weight. The strontium precursor used, strontium cyclohexanebutyrate, is available commercially from Eastman Chemicals. It was supplied with an assay indicating a strontium concentration of 19.4% by weight. The copper precursor was made by reacting copper acetate as described in Example 1. The copper content in the resulting precursor was 6.36% Cu by weight.

The (2:2:1:2) precursor was formed by combining the following amounts of the precursors:

5.0 g Bi (18.76% Bi)
2.31 g Ca (3.9% Ca)
4.48 g Cu (6.36% Cu)
2.03 g Sr cyclohexanebutyrate (19.4% Sr).

The mixture was heated at the boiling point until the strontium cyclohexane butyrate went into solution. At this point, a solution containing the correct proportion of cations for the (2:2:1:2) compound was obtained. To provide a film forming agent, 0.5 g rosin (Eastman 2315 ™) was then added and the mixture was gently heated until all the rosin went in solution.

A substrate was prepared by vacuum depositing a 1.6 μm Au layer and then a 0.1 μm Ag layer on a Si substrate with a 0.8 μm thermally grown $SiO_2$ film. The Ag was chosen to aid nucleation and growth of the later formed superconductive oxide. The precursor described above is spin-coated at 4000 rpm for 20 seconds and then heated to 550° C. at the rate of approximately 50° C. per minute followed by holding at 550° C. for 5 minutes. The sample was then allowed to cool to room temperature. The film thickness of the layer at this point was 0.7 μm. A second layer was deposited by the same procedure to obtain a total thickness of 1.4 μm.

The sample was rapidly inserted into a furnace preheated to 890° C. The sample was held for 1 and ½ minutes in the furnace and then rapidly removed. A well crystallized film resulted, with grain size of approximately 2 μm.

The sample was then coated with Norland #61 ™ photopolymer by spin coating the liquid (300 cp. viscosity) at 6000 rpm for 20 seconds. The sample was then exposed to U.V. using a Blak Ray Model B-100A ™ lamp for 15 minutes. The resulting film thickness of the Norland #61 ™ layer was approximately 16 μm The film was then transferred to a transparent adhesive tape as in Example 1. The resultant tape was quite flexible.

A four point probe resistivity measurement revealed the film to be superconducting. The resistivity from room temperature to about 45° K. decreased linearly

EXAMPLE 7

A five layer film of $Bi_2Sr_2CaCu_2O_{8+x}$ was prepared repeating the same procedure as in Example 6, except that five layers were spin-coated instead of two. Total film thickness of the $Bi_2Sr_2CaCu_2O_{8+x}$ layer was approximately 3.5 μm. The substrate and film were rapidly inserted into a pre heated furnace set at 890° C. and held at that temperature for 1½ minutes. The substrate and film were then rapidly removed from the furnace and allowed to cool down to room temperature.

X-ray diffraction of the film showed a c-axis highly oriented material. The orientation is highly desirable since it has been shown to provide high critical currents.

The sample was then spin-coated with a layer of Norland #61 TM photopolymer at 6000 RPM for 20 seconds which was ultraviolet cured for 10 minutes using a Blak Ray TM ultraviolet lamp. The film was then transferred to transparent adhesive tape as in Example 1. The resulting tape was quite flexible.

EXAMPLE 8

Since it is desirable to obtain large grain size for materials of the present invention, a new precursor was made which included 3% Ag and 3.5% Na atomic percent relative to the copper. This doping has been demonstrated to result in large grains at low temperatures on {100} oriented MgO single crystal substrates. Although there was an improvement also clearly visible in the Si/SiO₂/Au/Ag substrates, the effect was not as striking. For this reason high temperature processing was also needed in this case, although it resulted in larger grain sizes for equivalent processing conditions.

A $Bi_2Sr_2CaCu_2O_{8+x}$ precursor was prepared as follows:

The Bi, Cu, Sr precursors were similar to those used in Example 6. The Ca precursor was made by treating Ca carbonate with excess 2-ethylhexanoic acid and xylene as needed at 120° C. for 18 hours. The mixture was then filtered and dried with a molecular sieve as in Example 6. This was followed by concentration and filtering of the solution. Analysis showed 5.05% Ca by weight.

The (2:2:1:2) precursor was formulated by mixing the individual precursors as follows:

4.0 g Bi (18.76% Bi by weight)
3.637 g Cu (6.29% Cu by weight)
1.626 g Sr (19.4% Sr by weight)
1.428 g Ca (5.05% Ca by weight).

The mixture was heated at the boiling point until no solids remained. To provide a film forming agent, 0.7 grams of Kodak 2315 TM rosin was added and the mixture was gently heated until all the rosin went into solution. To this solution, the proper amount of Na and Ag metallo-organic precursors are mixed to add 3% Ag and 3.5% Na atomic percent relative to the copper.

The Ag precursor was made by mixing 0.3 g Ag-cyclohexanebutyrate (39.7% Ag by weight), 5 g 2-ethylhexanoic acid, and 0.9 g rosin. The mixture was heated until boiling to make a clear solution. The final solution had a concentration of $1.78 \times 10^{-4}M$ (Ag)/gram of solution.

The Na precursor was made by mixing 1.0 g Na cyclohexanebutyrate, 9.0 g of 2-ethylhexanoic acid and heating until boiling. The final solution had a concentration of $5.04 \times (10^{-4})M$ (Na/gram of solution).

The $Bi_2Sr_2CaCu_2O_{8+x}$ precursor ($3.16 \times 10^{-4}M$ (Cu/gram) was mixed with the Na and Ag precursors described above. In doing this, 5 g of the $Bi_2Sr_2CaCu_2O_{8+x}$ precursor was combined with 0.27 g and 0.11 g of the Ag and Na precursors, respectively. The solution was mixed thoroughly to provide good homogeneity. The resulting precursor was clear and exhibited good spin coating properties.

The precursor above was coated onto a Si substrate with films: 0.8 μm thermally grown $SiO_2$, 2.0 μm vacuum deposited Au, 0.2 μm vacuum deposited Ag. The doped $Bi_2Sr_2CaCu_2O_{8+x}$ film was spin-coated at 4000 rpm.

The film was heated on a hotplate up to 550° C. at 50° C./minutes and held at 550° C. for 5 minutes. The film was then allowed to cool to room temperature. Film thickness was approximately 0.5 μm. To compensate for the thinner film, four layers were deposited in this manner to achieve a total film thickness of 2.0 μm. If film thickness is much less than 1 μm, the underlying Au/Ag becomes visible on the top side of the superconducting film after the high temperature treatment.

To achieve large grain size, the four layer film was rapidly inserted in a pre heated furnace and allowed for 2 and ½ minutes at 890° C. Since it is known that at this temperature the $Bi_2Sr_2CaCu_2O_{8+x}$ may undergo some decomposition and precipitate into a semiconducting crystalline a phase, the film was heated at 865° C. for 2 and ½ minutes in an additional processing step to crystallize the superconducting phase.

The film was then coated with Norland #61 photopolymer as previously described and transferred to transparent tape as in Example 1.

A four point probe resistivity measurement revealed that the tape begins its superconductivity transition at approximately 85° K. Zero resistance was achieved at 36° K.

The invention has been described in detail with particular reference to preferred embodiments thereof, but it will be understood that variations and modifications can be effected within the spirit and scope of the invention.

What is claimed is:

1. An article comprised of
   a refractory substrate,
   a flexible electrically conductive crystalline cuprate layer,
   a release layer interposed between said flexible conductive cuprate layer and said substrate, said release layer being comprised of at least one of the metals of groups 8 to 11 and periods 5 and 6 of the periodic table of elements,
   a flexible organic film, and
   means for adhesively bonding said flexible organic film to said flexible conductive cuprate layer, so that said release layer, said flexible conductive cuprate layer, said adhesive bonding means and said flexible organic film can be stripped from said refractory substrate to form a flexible electrically conductive article.

2. An article according to claim 1 in which said cuprate layer is superconductive at temperatures in excess of 30° K.

3. An article according to claim 1 in which said cuprate layer is less than 25 μm in thickness.

4. An article according to claim 3 in which said cuprate layer is in the range of from 0.1 to 10 μm in thickness.

5. An article according to claim 4 in which said cuprate layer is in the range of from 0.5 to 5 μm in thickness.

6. An article according to claim 1 in which said release layer is electrically conductive.

7. An article according to claim 1 in which said release layer is at least 0.6 μm in thickness.

8. An article according to claim 7 in which said release layer is from 0.8 to 2 μm in thickness.

9. An article according to claim 1 in which said release layer is comprised of gold.

10. An article according to claim 9 in which said release layer consists essentially of gold.

11. An article according to claim 1 in which said release layer is comprised of at least one platinum metal chosen from the light and heavy platinum metal triads.

12. An article according to claim 11 in which said release layer is comprised of platinum or osmium.

13. An article according to claim 1 in which said release layer is comprised of silver.

14. A flexible electrically conductive article comprised of
a flexible organic film,
an electrically conductive crystalline cuprate layer,
means for adhesively bonding said flexible organic film to said conductive cuprate layer, and
a metal layer comprised of at least one of the metals of groups 8 to 11 and periods 5 and 6 of the periodic table of elements in contact with said cuprate layer.

15. An article according to claim 14 in which said cuprate layer is superconductive at temperatures in excess of 30° K.

16. An article according to claim 14 in which said cuprate layer is less than 25 μm in thickness.

17. An article according to claim 16 in which said cuprate layer is in the range of from 0.1 to 10 μm in thickness.

18. An article according to claim 17 in which said cuprate layer is in the range of from 0.5 to 5 μin thickness.

19. An article according to claim 14 in which said release layer is electrically conductive.

20. An article according to claim 14 in which said release layer is at least 0.6 μm in thickness.

21. An article according to claim 16 in which said release layer is from 0.8 to 2 μm in thickness.

22. An article according to claim 14 in which said release layer is comprised of gold.

23. An article according to claim 22 in which said release layer consists essentially of gold.

24. An article according to claim 14 in which said release layer is comprised of at least one platinum metal chosen from the light and heavy platinum metal triads.

25. An article according to claim 24 in which said release layer is comprised of platinum or osmium.

26. An article according to claim 14 in which said release layer is comprised of silver.

27. A method of forming an electrically conductive article comprised of a support and an electrically conductive crystalline cuprate layer, including the steps of
providing a refractory substrate and
forming the electrically conductive crystalline cuprate layer on the substrate,
characterized in that
a release layer is formed on the refractory substrate,
the cuprate layer is formed on the release layer,
an organic film support is bonded to the cuprate layer, and
the release layer, the cuprate layer, and the organic film support are formed to constitute a flexible electrically conductive article when stripped as a unit from the refractory substrate.

28. A method according to claim 27 further characterized in that a crystal growth accelerating agent is associated with the cuprate layer.

29. A method according to claim 28 further characterized in that the release layer is formed with the crystal growth accelerating agent forming a surface layer in contact with the cuprate layer.

30. A method according to claim 19 further characterized in that the surface layer of the release layer is a silver layer.

31. A method according to claim 27 further characterized in that the organic film, the cuprate layer, and the release layer are stripped from the substrate to produce the flexible electrically conductive article.

32. A method according to claim 27 further characterized in that the refractory substrate is chosen to provide a cylindrical surface for receipt of the release layer.

33. A method according to claim 32 further characterized in that the release and conductive cuprate layers and the organic film are formed as annuli on the cylindrical surface of the refractory substrate and are helically skived to facilitate stripping as an elongated continuous flexible electrically conductive article.

34. A method according to claim 33 further characterized in that a protective member is brought into contact with the continuous flexible article.

35. A method of forming an electrically conductive article comprised of a support and an electrically conductive crystalline cuprate layer, including the steps of
providing a refractory substrate and
forming an electrically conductive crystalline cuprate layer on the substrate,
characterized in that
a gold layer is formed on the refractory substrate,
a silver layer of from 0.1 to 1.0 μm in thickness is formed on the gold layer,
a precursor of the conductive crystalline cuprate layer is formed on the silver layer,
the precursor is heated to form the conductive crystalline cuprate layer,
a flexible organic film is bonded to the conductive crystalline cuprate layer, and
the gold layer, the conductive crystalline cuprate layer, and the flexible organic film are stripped as a unit from the refractory substrate to provide a flexible electrically conductive article.

* * * * *